(12) United States Patent
Rajendran et al.

(10) Patent No.: US 7,955,958 B2
(45) Date of Patent: Jun. 7, 2011

(54) METHOD FOR FABRICATION OF POLYCRYSTALLINE DIODES FOR RESISTIVE MEMORIES

(75) Inventors: Bipin Rajendran, White Plains, NY (US); Thomas Happ, Dresden (DE); Hsiang-Lan Lung, Elmsford, NY (US); Min Yang, Yorktown Heights, NY (US)

(73) Assignees: International Business Machines Corporation, Armonk, NY (US); Qimonda AG, Munich (DE); Macronix International Co., Ltd., Hsinchu (TW)

( * ) Notice: Subject to any disclaimer, the term of this patent is extended or adjusted under 35 U.S.C. 154(b) by 548 days.

(21) Appl. No.: 12/027,675

(22) Filed: Feb. 7, 2008

(65) Prior Publication Data

US 2009/0200534 A1    Aug. 13, 2009

(51) Int. Cl.
*H01L 21/20* (2006.01)

(52) U.S. Cl. .................. 438/486; 438/102; 257/E21.412

(58) Field of Classification Search .................. 438/486, 438/482, 487, 102, 103
See application file for complete search history.

(56) References Cited

U.S. PATENT DOCUMENTS

| 5,275,851 | A  * | 1/1994 | Fonash et al. ................. 438/479 |
| 2005/0062079 | A1 * | 3/2005 | Wu et al. ........................ 257/257 |
| 2006/0186483 | A1 * | 8/2006 | Cho et al. ...................... 257/390 |

* cited by examiner

*Primary Examiner* — Charles Garber
*Assistant Examiner* — Reema Patel
(74) *Attorney, Agent, or Firm* — Scully, Scott, Murphy & Presser, P.C.; Vazken Alexanian

(57) ABSTRACT

The present invention, in one embodiment, provides a method of producing a PN junction the method including at least the steps of providing a Si-containing substrate; forming an insulating layer on the Si-containing substrate; forming a via through the insulating layer to expose at least a portion of the Si-containing substrate; forming a seed layer of the exposed portion of the Si containing substrate; forming amorphous Si on at least the seed layer; converting at least a portion of the amorphous Si to provide crystalline Si; and forming a first dopant region abutting a second dopant region in the crystalline Si.

13 Claims, 4 Drawing Sheets

METHOD FOR FABRICATION OF POLYCRYSTALLINE DIODES FOR RESISTIVE MEMORIES

FIELD OF THE INVENTION

The present invention, in one embodiment, relates to microelectronics. More particularly, in one embodiment the present invention relates to diodes and memory devices,

BACKGROUND OF THE INVENTION

One property of a PN diode is that it conducts an electric current in one direction and blocks it in the other. This behavior arises from the electrical characteristics of a junction, called a PN junction fabricated within a semiconductor crystal. When p-type and n-type materials are placed in contact with each other, the junction behaves differently than either type of material alone. Current will flow readily in one direction (forward biased) but not in the other (reverse biased), creating the basic diode. This non-reversing behavior arises from the nature of the charge transport process in the two types of materials. PN diodes are used in a number of microelectronic devices including, but not limited to: transistors and memory devices.

SUMMARY OF THE INVENTION

In one aspect, the present invention provides a method of forming a PN junction. In one embodiment, the inventive method comprises:
providing a substrate comprising at least one conductive portion;
forming an insulating layer on the at least one conductive portion of the substrate;
forming a via through the insulating layer to provide an exposed portion of the at least one conductive portion of the substrate;
forming a seed material on at least a portion of the exposed portion of the at least one conductive portion of the substrate;
forming amorphous Si on the seed material to fill at least a portion of the via;
converting at least a portion of the amorphous Si to provide crystalline Si; and
forming a first dopant region abutting a second dopant region in the crystalline Si.

In one embodiment, the seed material is composed of Ni, Al, Pt, Pd, Ge, Co or alloys and combinations thereof. In one embodiment, the conversion of the amorphous Si that is deposited atop the seed material to crystalline material is provided by heating the amorphous Si to a temperature greater than the melting temperature of the amorphous Si, and less than the melting temperature of the substrate. In one embodiment, implanting P-type and N-type dopants into the crystalline Si forms the dopant regions of the PN junction. In one embodiment, the PN junction formed from the above method is integrated with a resistive memory device, phase change memory device, or a combination thereof.

In another aspect of the present invention, a method of making a memory device is provided. In one embodiment, the method of making the memory device includes the steps of:
providing a substrate including at least one conductive portion;
forming a seed material on the at least one conductive portion of the substrate;
forming amorphous Si on at least the seed material;
converting at least a portion of the amorphous Si to crystalline Si;
forming a PN junction in the crystalline Si; and
forming a memory cell in contact with the PN junction.

In one embodiment, the method of forming the memory cell includes forming a silicide contact on a dopant region of the PN junction; forming an electrode atop the silicide contact; and forming a phase change memory material atop the electrode. In another embodiment, the method includes forming an insulating layer on the substrate prior to the formation of the seed material, and forming a via through the insulating layer to expose a surface of at least one conductive portion in the substrate, wherein the seed material is then deposited on the exposed surface of the at least one conductive portion.

In one embodiment, the electrode of the memory cell is formed by recessing the crystalline Si below an upper surface of the insulating layer to expose sidewalls of the via; forming spacers on the sidewalls of the via; and depositing a barrier metal in the via atop the silicide contact.

In one embodiment, the method further includes forming a second barrier metal atop the phase change memory material; and etching the second barrier metal and phase change memory material to provide a barrier metal/phase change memory material stack. In one embodiment, the width of the barrier metal/phase change memory material stack is greater than the width of the electrode to the PN junction.

In another aspect, the present invention provides a memory device including a phase change material and a crystalline Si diode. In one embodiment, the memory device includes:
a phase change material; and a crystalline Si diode in electrical contact with the phase change material.

In one embodiment, the crystalline Si diode is composed of polycrystalline Si (also referred to as polysilicon). In another embodiment, the crystalline Si is composed of a single crystal of Si. In one embodiment, the crystalline Si diode comprises a first dopant region and a second dopant region, wherein the electrical conductivity of the first dopant region is different that the second dopant region. In one embodiment, the first dopant region is formed abutting the second dopant region along a vertical axis of the crystalline Si diode. In one embodiment, the memory device includes an electrode between the phase change material and the crystalline Si diode, wherein the width of the electrode is less than the width of the crystalline Si diode. In another embodiment, the phase change material is composed of GST and the electrode is composed of a barrier metal.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
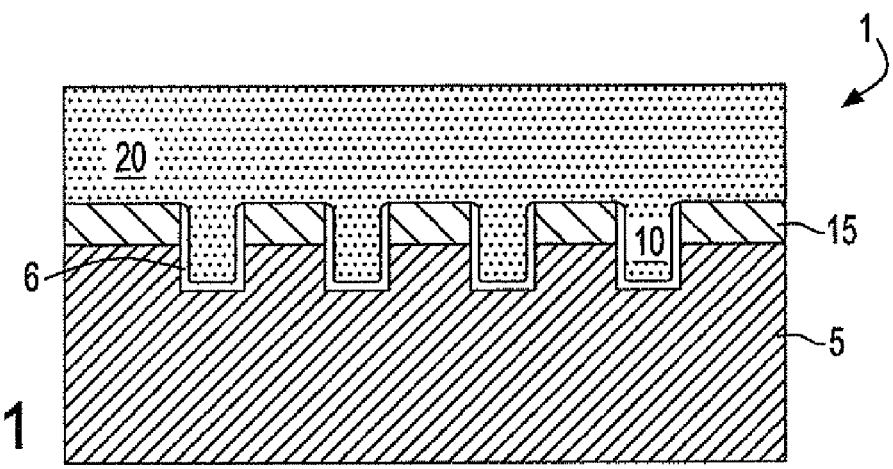
FIG. 1 is a cross sectional side view of one embodiment of an initial structure including a substrate, an insulating layer atop the substrate and isolation regions extending into the substrate, as used in accordance with the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods for producing a PN junction in crystalline Si and forming a memory device. When describing the inventive method and structures, the following terms have the following meanings, unless otherwise indicated.

As used herein, "PN junction" refers to a junction that is formed by combining N-type and P-type semiconductors. The term junction refers to the interface where the two types of semiconductors meet.

As used herein, a "P-type semiconductor" refers to the addition of trivalent impurities such as boron, aluminum or gallium to an intrinsic semiconductor substrate that creates deficiencies of valence electrons.

As used herein, an "N-type semiconductor" refers to the addition of pentavalent impurities such as antimony, arsenic or phosphorous that contributes free electrons to an intrinsic semiconductor substrate.

As used herein, the term "memory device" means a structure in which the electrical state of which can be altered and then retained in the altered state; in this way a bit of information can be stored.

As used herein, the term "resistive memory device" denotes a device whose effective electrical resistivity can be switched between two or more resistivity (ohms) upon an application of an energy pulse, such as a voltage or current pulse. Pulse time may range from approximately 5 nanoseconds to approximately 1 micro-second.

As used herein, the term "phase change material memory device" denotes a memory device including a memory cell composed of a phase change material.

As used herein, a "phase change material" denotes a material that converts from a first phase to a second phase upon the application of energy.

As used herein, the term "amorphous Si" denotes a non-crystalline form of silicon.

As used herein, the term "seed material" denotes a material used to promote crystallization in another material.

As used herein, the term "crystalline" denotes a solid in which the constituent atoms, molecules and/or ions are packed in an ordered, repeating pattern extending in all three spatial dimensions.

As used herein, the term "single crystal" denotes a crystalline solid, in which the crystal lattice of the entire sample is continuous having substantially no grain boundaries.

As used herein, the term "polycrystalline Si" denotes a material composed of multiple Si crystals.

As used herein, the term "insulating" and "dielectric" denote a non-metallic material that has a filled valance band at 0K and a band gap on the order of approximately 5 eV, wherein the room temperature conductivity is less than about $10^{-10}$ $(ohm-m)^{-1}$.

As used herein, the term "Si containing substrate" refers to a substrate of a device including at least Si or a layer formed atop a device substrate including at least Si.

As used herein, "dopant region" refers to a solid-state material in which the electrical conductivity of the region is dependent upon n-type or p-type dopants, and the valence band and the conduction band are separated by the energy gap that may be as great as about 3.5 eV.

As used herein, a "barrier metal" is a material used to chemically isolate semiconductors from metal, and provides an electrical connection between them.

A "silicide" is an alloy of a metal and silicon.

"Chemical Vapor Deposition" is a deposition process in which a deposited species is formed as a result of chemical reaction between gaseous reactants at greater than room temperature; wherein solid product of the reaction is deposited on the surface on which a film, coating, or layer of the solid product is to be formed.

A "via" is a hole etched in a dielectric which is then filled with a conductive material or semiconducting material to provide vertical connection between stacked up interconnect metal lines or interconnect metal lines and devices.

As used herein "the at least one conductive portion" denotes a structure, such as a metal stud, metal bar, word line, bit line, and/or combination thereof formed of a conductive material, such as a metal or doped silicon, that provides electrical communication to a device, such as a PN junction or memory device.

As used herein, the term "electrical communication" means that a first structure or material can conduct electricity to a second structure or material.

The term "direct physical contact" means that a first structure and a second structure are positioned in contact without any intermediary conducting, insulating or semiconducting layer at the interface of the two structures.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

FIG. 1 depicts one embodiment of an initial structure that may be used to form a PN junction, in accordance with the present invention. In one embodiment, the initial structure 1 may include a substrate 5, isolation region 10, at least one conductive portion 15 and a first insulating layer 20.

In one embodiment, the substrate 5 may be composed of a semiconducting material. In one embodiment, the substrate 5 may be a Si containing substrate. Illustrative examples of Si-containing substrates include, but are not limited to: Si, SiGe, SiC, SiGeC, epi Si/Si, epi Si/SiC, epi Si/SiGe, and preformed silicon-on-insulators (SOIs) or SiGe on insulators (SGOIs) which may include any number of buried insulating (i.e., continuous, non-continuous or a combination of continuous and non-continuous) regions formed therein. In another embodiment, the Si-containing substrate may be composed of single crystal Si, amorphous Si, or polycrystalline Si. In yet another embodiment, the Si-containing substrate may be formed of <100> or <110> Si. In another embodiment, the substrate 5 may comprise a metal. In yet another embodiment, the substrate 5 may comprises an insulating material having a conductive portion corresponding to a later formed PN junction.

In one embodiment, the substrate 5 may house electrical devices including, but not limited to, memory devices, such as phase change memory devices and resistive memory devices; switching devices including but not limited to transistors, such as field effect transistors; capacitors; and resistors.

In one embodiment, the at least one conductive portion 15 may be at least one conductive liner, such as a word line or bit line. In one embodiment, the at least one word line may be a plurality of parallel word lines that when employed with a plurality of bit lines, which extend across the substrate 5 in a direction substantially perpendicular to the word lines, provides the electrical connection structure of a memory array. In one embodiment, each of the word lines contact the diode of a memory cell and each of the bit-lines contact the top electrode of a memory cell. In an embodiment of the present invention utilizing a 300 mm wafer as a substrate 2, the number of word lines and bit lines are selected to provide connectivity to about one million memory cells, hence providing one mega byte.

In one embodiment, the conductive portions 15 are formed by implanting a dopant species, such as an N-type or P-type dopant, into a semiconducting Si-containing substrate. In another embodiment, the conductive portion 15 may be provided by physical vapor deposition, such as sputtering, or chemical vapor deposition of a metal. In yet another embodiment, the conductive portion 15 may be provided by a combination of physical vapor deposition and chemical vapor deposition.

In one embodiment, the isolation region 10 is a trench filled with an insulating material, such as an oxide, nitride, or oxynitride. In one embodiment, the isolation region 10 is positioned separating adjacent conductive portions 15, such as conductive lines, from one another. In one embodiment, the isolation region 10 is a shallow trench isolation (STI) region. In one embodiment, the shallow trench isolation region may be formed by etching a trench in the substrate 5 utilizing a conventional dry etching process, such as reactive-ion etching (RIE) or plasma etching. In one embodiment, the trenches may be etched into the substrate with an anisotropic etch step to a depth below the lower surface of the conductive portions 15, such as conductive lines that are present in the substrate 5. The trenches may optionally be lined with a liner material 6, e.g., an oxide. In one embodiment, chemical vapor deposition or another like deposition process is used to fill the trench with a semiconductor such as polysilicon or a STI dielectric material, such as an oxide. The STI dielectric may optionally be densified after deposition. A planarization process, such as chemical-mechanical polishing (CMP), may optionally be used to provide a planar structure.

In one embodiment, the first insulating layer 20 is an inter-layer dielectric that may include but is not limited to an oxide, nitride or oxynitride material. For the purposes of the following disclosure, the first insulating layer 20 will be referred to as an oxide, but it is noted that other insulating materials may be utilized so long as the selection of the material of the first insulating layer 20 provides for etch selectivity to adjacent layers of the device during subsequent etch processes. The first insulating layer 20 may be provided by a deposition process, such as chemical vapor deposition, or a growth process, such as oxidation. In one embodiment, the first insulating layer 20 may be used in conjunction with a process flow for forming the isolation regions 10, wherein the first insulating layer 20 may be deposited following the formation of an isolation trench or following the formation of the trench sidewall spacers. In one embodiment, the upper surface of the first insulating layer 20 is planarized, wherein the planarization process may be chemical mechanical polishing.

Figure 2:
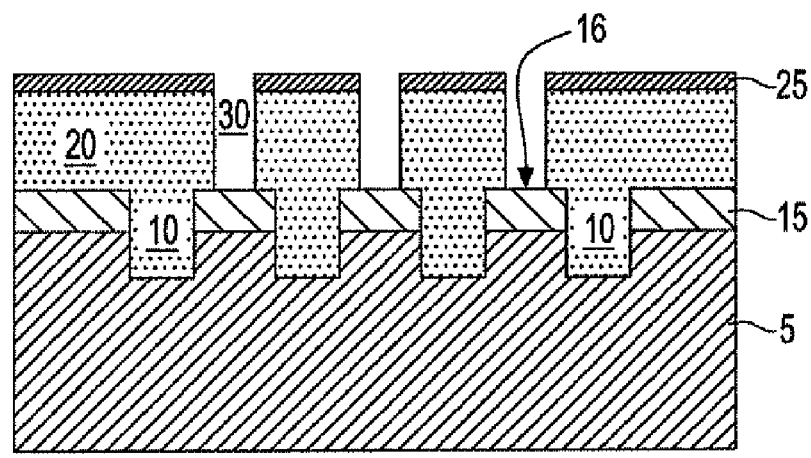
FIG. 2 is a cross sectional side view depicting one embodiment of forming at least one via through the insulating layer to expose a portion of at least one conductive region in the substrate, in accordance with the present invention.

FIG. 2 depicts one embodiment of the formation of a via 30 through the first insulating layer 20 to expose a portion of an upper surface 16 of the conductive portion 15 of the substrate 5. In one embodiment, the formation of the via 30 may begin with the deposition of a second insulating layer 25 atop the first insulating layer 20. For example, in embodiments of the present invention when the first insulating layer 20 is an oxide, the second insulating layer 25 may be a nitride. In a following process step, both insulating layers 25 and 20 are patterned corresponding to the sites of the structure overlying the conductive portion 15 of the substrate 5. In one embodiment, the second insulating layer 25 is etched selective to the first insulating layer 20, and in a following step, the etched second insulating layer 25 is utilized as an etch mask and the first insulating layer 20 is etched selective to a portion of the substrate 5 on which the conductive portion 15 is positioned. In one embodiment, this etch step exposes an upper surface 16 of the conductive portion 15 of the substrate 5, which may be a conductive line. In one embodiment, the formation of the via 30 includes an anisotropic etch step that may be reactive ion etch.

Figure 3:
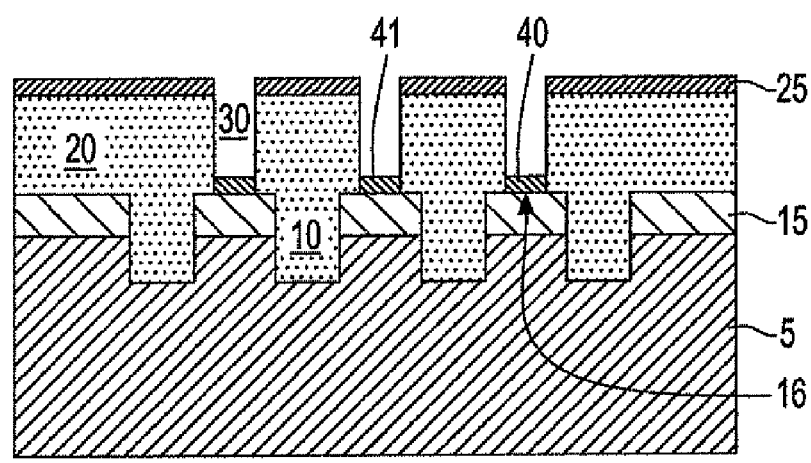
FIG. 3 is a cross sectional side view depicting one embodiment of forming a seed material in the via, in accordance with the present invention.

FIG. 3 depicts one embodiment of the formation of a seed material 40 atop at least the exposed surface 16 of the conductive portion 15. In one embodiment, the seed material 40 may be composed of Ni, Al, Pt, Pd, Ge, NiSi, Co, CoSi, or alloys and combinations thereof. In one embodiment, formation of the seed material 40 may include the formation of a layer of seed material 40. In one embodiment, the layer of seed material 40 may have a thickness ranging from about 5 nm to about 100 nm. In one embodiment, the layer of seed material 40 may be formed atop the exposed surface 16 of the conductive portion 15 by a deposition step, such as chemical vapor deposition or physical vapor deposition, One example of physical vapor deposition is sputtering. Examples of chemical vapor deposition include, but are not limited to: Atmospheric Pressure CVD (APCVD), Low Pressure CVD (LPCVD) and Plasma Enhanced CVD (PECVD), Metal-Organic CVD (MOCVD) and combinations thereof.

Figure 4:
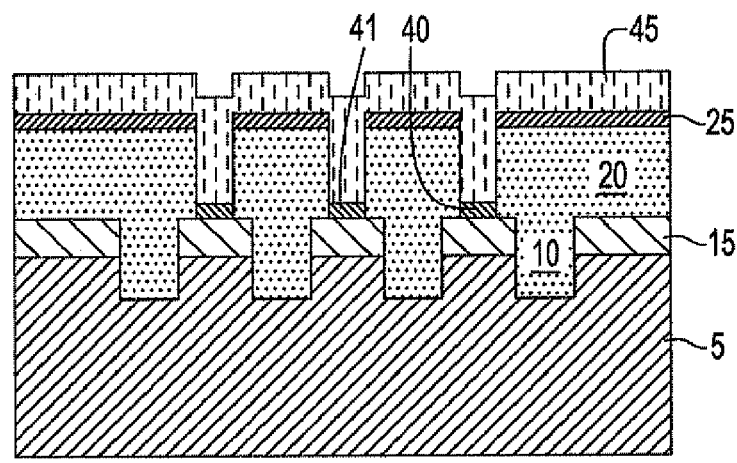
FIG. 4 is a cross sectional side view depicting one embodiment of an amorphous Si deposition within the via, in accordance with the present invention.

FIG. 4 depicts one embodiment of the deposition of the amorphous Si 45 onto the seed material 40 to fill at least a portion of the via 30. The amorphous Si 45 may be formed in direct physical contact with an upper surface 41 of the seed material 40. In one embodiment, the amorphous Si 45 may be deposited filling the via 30 and extending atop the upper surface of the second insulating material layer 25. The amorphous Si 45 may be deposited by a chemical vapor deposition method similar to the examples of chemical vapor deposition described above with reference to the formation of the seed material 40. In one embodiment, the amorphous Si 45 may be formed by chemical vapor deposition, in which the deposition temperature is in the range of about 300° C. to about 500° C. and the silane gas flow rate is in the range of about 0.5 slm to about 2 slm at pressures less than about 200 milli-torr.

Figure 5:
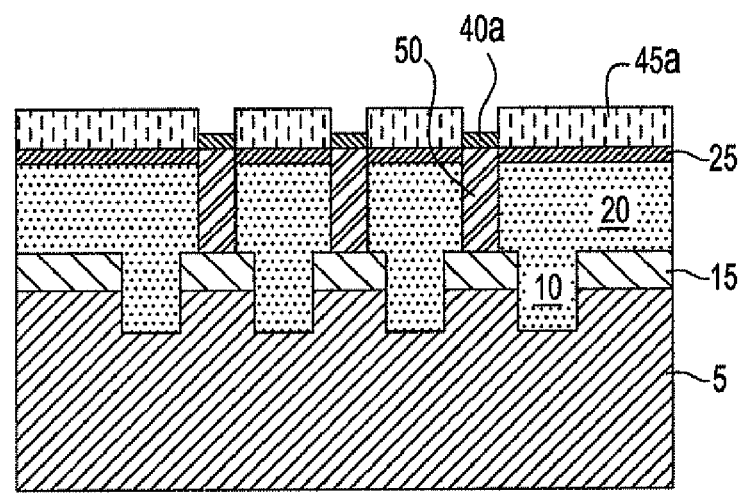
FIG. 5 is a cross sectional view depicting one embodiment of a method step to convert the amorphous Si to crystalline Si, in accordance with the present invention.

Referring to FIG. 5, in a following step at least a portion of the amorphous Si 45 within the via 30 is converted into crystalline Si 50. In one embodiment, at least a portion of the amorphous Si 45 is converted to polycrystalline Si, which may also be referred to as polysilicon. In one embodiment, converting at least a portion of the amorphous Si 45 to crystalline Si includes converting substantially the entire amount of amorphous Si 45 within the via 30 to polycrystalline Si 50. In one embodiment, converting the amorphous Si 45 to crystalline Si 50 includes increasing the temperature of amorphous Si 45 to greater than its melting temperature, wherein following melting the amorphous Si 45 is converted to crystalline Si 50 by recrystallization during solidification. In one embodiment, the amorphous Si 45 is converted to crystalline Si 50 by increasing the temperature of the amorphous Si 45 to greater than about 400° C. and less than about 700° C. for a time period ranging from about 1 hour to about 24 hours, wherein the crystalline Si 50 may be polycrystalline Si. In another embodiment, the amorphous Si 45 is converted to crystalline Si 50 by increasing the temperature of the amorphous Si 45 to greater than about 500° C. and less than about 650° C. for a time period ranging from about 1 hour to about 20 hours. In one embodiment, converting the amorphous Si 45 into crystalline Si 50 includes an annealing process that may include furnace anneal, laser anneal, or rapid thermal anneal. In one embodiment, the portion of amorphous Si 45 that is being converted to crystalline Si 50 fills the via 30. In one embodiment, the amorphous Si 45 may be converted into a single crystal of Si.

Figure 6:
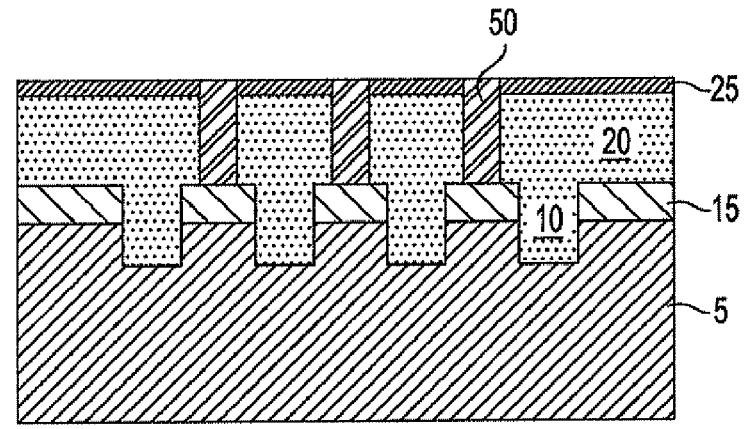
FIGS. 6 and 7 are side cross sectional views depicting one embodiment of the formation of the dopant regions of a PN junction in the crystalline Si, in accordance with the present invention.

In one embodiment, the seed material 40 is a catalyst for crystalline growth during the conversion of amorphous Si 45 to crystalline Si 50, wherein crystalline growth begins at the interface between the seed material 40 and the amorphous Si 45. In one embodiment, the crystalline growth extends upward from the upper surface of the seed material 40, wherein a layer of seed material 40 remains atop the region of crystalline growth. In one embodiment, at the conclusion of the conversion of amorphous Si 45 to crystalline Si 50, the crystalline Si 50 extends from the uppermost surface of the conductive portion 15 filling the via 30, and the layer of seed material 40a is now positioned atop the crystalline Si 50 at the upper most surface of the via 30. In one embodiment, the seed material 40a, which is now separated from the conductive portion 15 by the crystalline Si 50, is removed by an etch process, such as wet etch or reactive ion etch. In one embodiment, following the conversion of the amorphous Si 45 to crystalline Si 50, a remaining portion of amorphous Si 45a, may be removed by a planarization step, such as CMP, and/or an etch step, such as RIE selective to the first insulating layer 20, to provide a structure similar to that depicted in FIG. 6.

Figure 7:
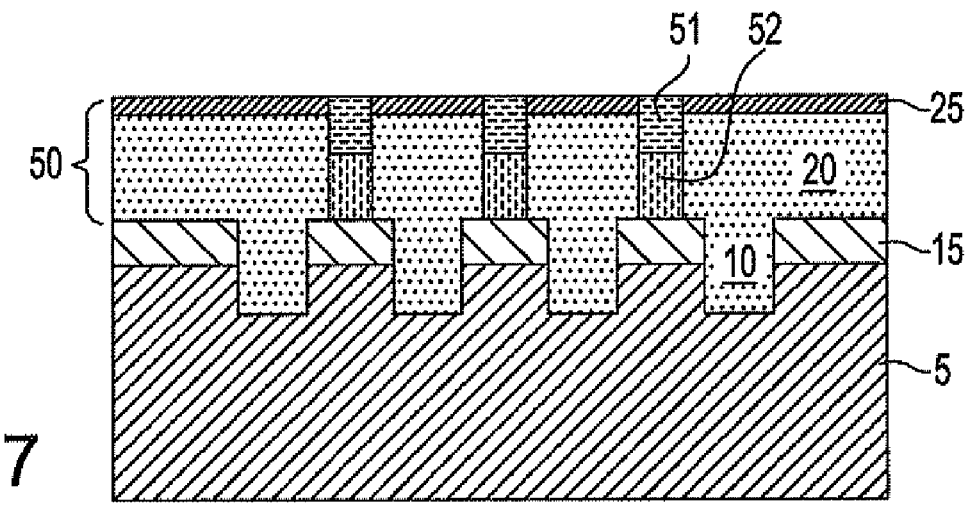

FIG. 7 depicts one embodiment of the formation of dopant regions 51, 52 in the crystalline Si 50, in accordance with the present method. In one embodiment, the dopant regions 51, 52 may include a first dopant region 51 and a second dopant region 52, wherein the first dopant region 51 has a different electrical conductivity than the second dopant region 52. In one embodiment, the first dopant regions 51, and second dopant region 52 provide a PN junction in the crystalline Si 50. In one embodiment, the first dopant region 51 is formed abutting the second dopant region 52 along a vertical axis of the crystalline Si 50. In one embodiment, the first dopant region 51 and the second dopant region 52 may be positioned in a stacked orientation in the crystalline Si 50, wherein in one embodiment the second dopant 52 is positioned at a greater depth from the upper surface of the crystalline Si 50 than the first dopant region 51. The dopant regions 51, 52 may be formed by implantation of an N-type or P-type dopants in the crystalline Si 50 within the via 30. In one embodiment, the first dopant region 51 is a P-type dopant and the second dopant region 52 is an N-type dopant. In another embodiment, the second dopant region 52 is a P-type dopant and the first dopant region 51 is an N-type dopant. In one embodiment, the dopant regions 51, 52 may be formed following an etch step to recess the upper surface of the crystalline Si 50.

P-type dopants for ion implantation into the converted crystalline Si 50 may include group III-A elements, such as B. N-type dopants for ion implantation into the converted crystalline Si may include group V elements, such as As or P. In one embodiment, implant conditions for a P-type dopant includes an implant energy of from about 0.5 keV to about 100 keV and a dose is from about $1 \times 10^{13}$ atoms/cm$^2$ to about $1 \times 10^{15}$ atoms/cm$^2$, wherein the dopant species may be B or BF$_2$. In one embodiment, implant conditions for an N-type dopant includes an implant energy of from about 10 keV to about 500 keV and a dose of from $1 \times 10^{13}$ atoms/cm$^2$ to about $1 \times 10^{15}$ atoms/cm$^2$, wherein the dopant species may be P or As.

Figure 8:
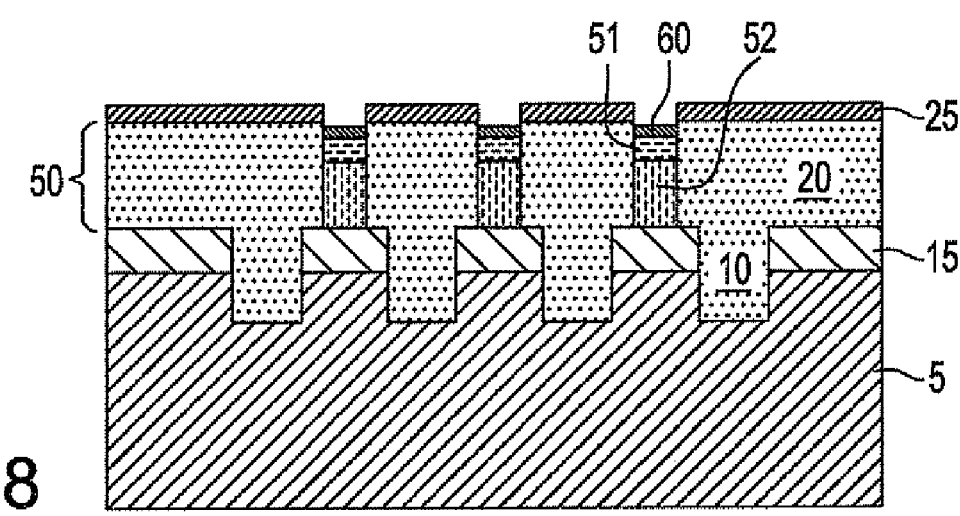
FIG. 8 is a side cross sectional view depicting the formation of a silicide atop a dopant region of a PN junction, in accordance with one embodiment of the present invention.

Referring to FIG. 8, in one embodiment a silicide contact 60 may be formed atop a doped region 51 of the crystalline Si 50. In one embodiment, the upper surface of the crystalline Si 50 in which the dopant region 51 is formed may be recessed prior to the formation of the silicide contact 60. In one embodiment, the upper surface of the crystalline Si 50 may be recessed by an etch process step, such as reactive ion etch, selective to the second insulating material 25. In one embodiment, silicide formation typically requires depositing a silicide forming metal, such as Ni or Ti, onto the upper surface of the crystalline Si 50, and annealing. During the annealing step, the deposited silicide forming metal reacts with Si forming a metal silicide. In one embodiment, annealing may include rapid thermal annealing. In one embodiment, the un-reacted silicide forming metal may be removed by a wet etch.

Figure 9:
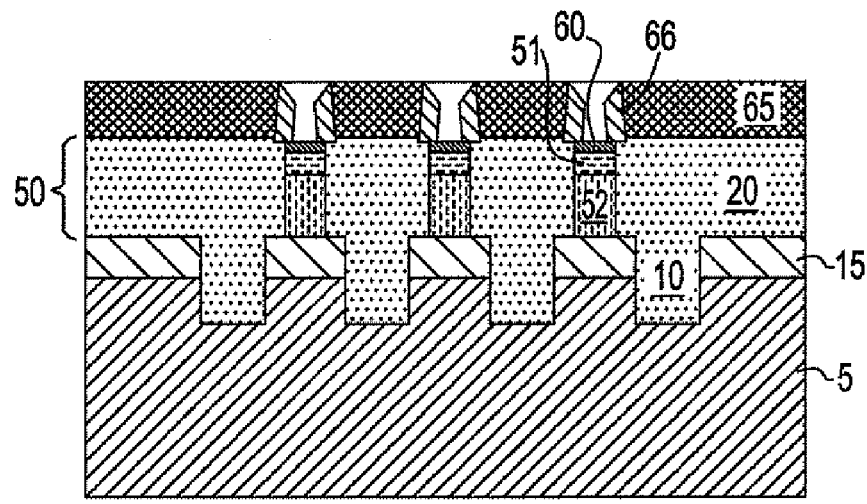
FIGS. 9 and 10 are side cross sectional views that depict the formation of memory devices atop the PN junction.
Figure 10:
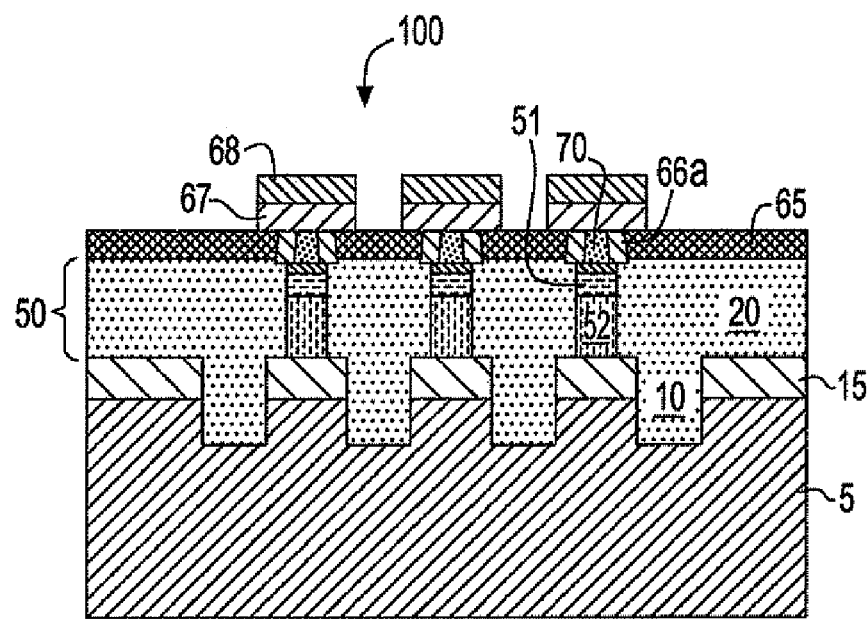

Referring to FIGS. 9 and 10, in one embodiment of the present invention, a memory cell 100 is formed atop the upper surface of the PN junction. In one embodiment, the method of forming of the memory cell 100 includes forming a phase change electrode 70 atop the silicide contact 60; and forming a phase change memory material 67 atop the phase change electrode 70.

Referring to FIG. 9, in one embodiment, forming the phase change electrode 70 includes depositing a third insulating layer 65 atop the upper surface of first insulating layer 20 (or second insulating layer 25 when present); etching the third and first insulating layers 65, 20 using lithography and etch processes to provide via's exposing an upper surface of the silicide contact 60 of the doped region 51 of the crystalline Si 50; forming a spacer 66 along the via sidewall; and depositing a barrier metal atop the silicide contact 60 of the doped region 51.

In one embodiment, the phase change electrode 70 is composed of a barrier metal and fills the via that was formed to expose the upper surface of the crystalline Si 50, wherein the phase change electrode 70 has a width ranging from about 2 nm to about 60 nm as defined by the dimension separating the opposing spacers 66. In one embodiment, the third insulating layer 65 comprises an oxide and the spacer is composed of a nitride. In one embodiment, the barrier metal that provides the phase change electrode 70 is formed as a layer atop the upper surface of the crystalline Si 50 using a physical deposition method, such as sputtering, or chemical vapor deposition. In one embodiment, the barrier metal that provides the phase change electrode 70 may be composed of TiN, TaN, TiSiN, TaSiN, TiAlN, TaAlN, TiW, W, Ru or combinations thereof.

Referring to FIG. 10, in one embodiment, the phase change material 67 may be switched from an amorphous phase to a crystalline phase. When in an amorphous state, the phase change material 67 is generally less conductive than in the crystalline state. In one embodiment, the phase change material 67 may comprise chalcogenide alloys. The term "chalcogenide" is used herein to denote an alloy or compound material, which contains at least one element from Group VI of the Periodic Table of Elements. Illustrative examples of chalcogenide alloys that can be employed herein include, but are not limited to, alloys of Te or Se with at least one of the elements of Ge, Sb, As, Si. In other embodiments, the phase change material 67 is made of any suitable material including one or more of the elements Ge, Sb, Te, Ga, In, Se, and S. In one embodiment, the phase change material 67 has a composition of $Ge_2Sb_2Te_5$ (GST).

In one embodiment, a phase change material 67 composed of GST when at a temperature of about 25° C. is in an amorphous phase. As the temperature of the GST phase change material 67 is increased to about 125° C., the resistivity of the phase change material 67 decreases representing the transition temperature for a phase change from an amorphous phase to face centered cubic (FCC) phase. Further increases in the temperature of the GST phase change material 67 to greater than about 180° C. result in further decreases in resistivity, which result from a phase change from the face centered cubic (FCC) phase to a Hexagonal (Hex) phase of the GST. When the temperature of the GST phase change material 67 is increased above the melting temperature (620° C.), the GST phase change material 67 melts and upon rapid cooling, i.e. quench, returns to the amorphous solid phase.

In one embodiment, the phase change material 67 may be blanket deposited atop the upper surface of the phase change electrode 70 by a chemical vapor deposition process. In one embodiment, the thickness of the phase change material 67 may range from about 3 nm to about 150 nm. Thereafter, a layer of barrier metal 68, such as TiN, TaN, W, TiSiN, TaSiN, TiAlN, or TaAlN, is deposited atop the phase change material 67. In one embodiment, the layer of barrier metal 68 may have a thickness ranging from about 2 nm to about 100 nm. In a following process step, the barrier metal layer/phase change material stack is patterned by applying a photolithography and etch process. More specifically, in one embodiment, a pattern is produced by applying an antireflection coating and photoresist to the layer of barrier metal 68; exposing the photoresist to a pattern of radiation selected to provide at least one barrier metal layer/phase change material area corresponding to the underlying PN diodes; and then developing the pattern into the photoresist utilizing resist developer. Once the patterning of the photoresist is completed, the sections covered by the photoresist are protected, while the exposed regions are removed using a selective etching process that opens the antireflection coating and removes the unprotected regions. In one embodiment, the width of the barrier metal layer/phase change material stack is greater than the width of the phase change electrode 70.

In another embodiment, prior to the formation of the phase change material 67 a third dielectric layer 65 is deposited atop the first insulating layer 20, and is then patterned and etched to provide vias exposing an upper surface of the phase change electrode 70. In one embodiment, the width of the vias is selected to be greater than the width of the phase change electrode 70. In a following process step, a barrier metal layer/phase change material stack is formed in the via, wherein the phase change material 67 is in direct physical contact with the upper surface of the phase change electrode 70.

While the present invention has been particularly shown and described with respect to the preferred embodiments thereof, it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed is:

1. A method of producing a PN junction comprising:
   providing a substrate comprising at least one conductive portion;
   forming an insulating layer on the substrate;
   forming a via through the insulating layer to provide an exposed surface of the at least one conductive portion;
   forming a seed material on the exposed portion of the at least one conductive portion of the substrate;
   forming amorphous Si on at least the seed material;
   converting at least a portion of the amorphous Si to provide crystalline Si; and
   forming a first dopant region abutting a second dopant region in the crystalline Si, wherein the forming of the first dopant region in the crystalline Si comprises implanting a P-type dopant and the forming the second dopant region comprises implanting an N-type dopant.

2. The method of claim 1, wherein the crystalline Si comprises polycrystalline Si or a single crystal of Si.

3. The method of claim 1, wherein the seed material comprises Ni, W, Al, Pt, Pd, Ge, Co, NiSi, CoSi, TiSi, WSi or alloys thereof.

4. The method of claim 1, wherein the seed material has a thickness ranging from about 2 nm to about 100 nm.

5. The method of claim 1, wherein the converting of the at least the portion of the amorphous Si into the crystalline Si comprises increasing a temperature of the amorphous Si to greater than about 400° C. and less than about 700° C. for a time period ranging from about 1 hour to about 24 hours.

6. The method of claim 1, wherein the converting of the at least the portion of the amorphous Si into the crystalline Si comprises an annealing process comprising furnace anneal, laser anneal, rapid thermal anneal or combinations thereof.

7. A method of forming a memory device comprising:
   providing a substrate comprising at least one conductive portion;
   forming a seed material on the at least one conductive portion of the substrate;
   forming amorphous Si on at least the seed material;
   converting at least a portion of the amorphous Si to crystalline Si;
   forming a PN junction in the crystalline Si, wherein the forming of the PN junction comprises implanting the crystalline Si to provide a first dopant region of P-type dopants, and a second dopant region of N-type dopants; and
   forming a memory cell in contact with the PN junction.

8. The method of claim 7, wherein the forming of the memory cell comprises:
   forming a silicide contact on a dopant region of the PN junction;
   forming an electrode atop the silicide contact; and forming a phase change memory material atop the electrode.

9. The method of claim 8 further comprising forming an insulating layer on the substrate and forming a via through the insulating layer to an exposed surface of the at least one conductive portion, wherein the step of the forming of the amorphous Si on the seed material substantially fills the via with the amorphous Si.

10. The method of claim 9 further comprising:
    forming a barrier metal atop the phase change memory material; and
    etching the barrier metal and phase change memory material to provide a barrier metal/phase change memory material stack.

11. The method of claim 10, wherein the width of the barrier metal/phase change memory material stack is greater than the width of the electrode.

12. The method of claim 11, wherein the forming of the electrode comprises:
    recessing the crystalline Si below an upper surface of the insulating layer to expose sidewalls of the via;
    forming spacers on sidewalls of the via; and
    depositing a barrier metal in the via atop the silicide contact.

13. The method of claim 8, wherein the seed material comprises Ni, Al, Pt, Pd, Ge, Co, W, NiSi, CoSi, TiSi, WSi or alloys thereof.

* * * * *